United States Patent
Lee et al.

(10) Patent No.: US 7,890,841 B2
(45) Date of Patent: *Feb. 15, 2011

(54) POST-VITERBI ERROR CORRECTION METHOD AND APPARATUS

(75) Inventors: Jun Lee, Seongnam-si (KR); Jihoon Park, Minneapolis, MN (US); Jaekyun Moon, Minneapolis, MN (US)

(73) Assignees: Samsung Electronics Co., Ltd., Suwon-si, Gyeonggi-do (KR); Regents of the University of Minnesota, Minneapolis, MN (US)

( * ) Notice: Subject to any disclaimer, the term of this patent is extended or adjusted under 35 U.S.C. 154(b) by 1128 days.

This patent is subject to a terminal disclaimer.

(21) Appl. No.: 11/598,806

(22) Filed: Nov. 14, 2006

(65) Prior Publication Data

US 2008/0115035 A1    May 15, 2008

(51) Int. Cl.
*H03M 13/00* (2006.01)
(52) U.S. Cl. ...................... 714/780; 714/785
(58) Field of Classification Search ........... 714/780, 714/785
See application file for complete search history.

(56) References Cited

U.S. PATENT DOCUMENTS

| | | | | |
|---|---|---|---|---|
| 4,833,679 A | * | 5/1989 | Anderson et al. | 714/758 |
| 4,849,975 A | * | 7/1989 | Patel | 714/761 |
| 5,438,577 A | * | 8/1995 | Nakase et al. | 714/785 |
| 5,521,945 A | * | 5/1996 | Knudson | 375/341 |
| 5,689,532 A | * | 11/1997 | Fitzpatrick | 375/341 |
| 5,926,490 A | * | 7/1999 | Reed et al. | 714/787 |
| 5,961,658 A | * | 10/1999 | Reed et al. | 714/746 |
| 6,052,248 A | * | 4/2000 | Reed et al. | 360/53 |
| 6,185,173 B1 | * | 2/2001 | Livingston et al. | 369/59.21 |
| 6,185,175 B1 | * | 2/2001 | Zook | 369/53.35 |
| 6,516,443 B1 | * | 2/2003 | Zook | 714/792 |
| 6,530,060 B1 | * | 3/2003 | Vis et al. | 714/792 |
| 6,694,477 B1 | * | 2/2004 | Lee | 714/784 |
| 6,732,328 B1 | | 5/2004 | McEwen et al. | |
| 6,981,201 B2 | * | 12/2005 | Reggiani et al. | 714/786 |
| 7,454,690 B1 | * | 11/2008 | Au et al. | 714/780 |
| 7,620,879 B2 | * | 11/2009 | Park et al. | 714/785 |
| 7,644,338 B2 | * | 1/2010 | Park et al. | 714/758 |

* cited by examiner

*Primary Examiner*—Joseph D Torres
(74) *Attorney, Agent, or Firm*—Volentine & Whitt, PLLC (57) ABSTRACT

In an error correction method, a codeword is transmitted through a noisy communication channel and detected by a receiving device. An error detection code is then applied to the detected codeword to generate a syndrome. Where the syndrome is not all zero, the codeword is determined to contain some error. Accordingly, the method computes a set of potential error start positions for a plurality of error events based on a syndrome value corresponding to the syndrome. Next, a confidence value is computed for each of the plurality of error events at each of the potential error start positions in the refined set, and finally, a most likely error event in the detected codeword is corrected based on an error event and corresponding potential error start position having the highest confidence value.

6 Claims, 10 Drawing Sheets

- *Conventional Scheme → mis-correction*

Actual error event & error position
- error event : [2, -2]
- error position : [137, 138]
- syndrome = 2

Error Event : Candidate Error Starting Position
[2 -2], [2 -2 2 -2 -2], [2 -2 2 -2 2], [2 -2 2 -2 2 -2], [2 -2 0 2 -2]... : [1, 2, 3, ..., n (codeword length = 203)]

| Confidence Value | Error Event | | | | | | | 83 | 84 | Error Position | | | | |
|---|---|---|---|---|---|---|---|---|---|---|---|---|---|---|
| 4.8763e-001 (largest) | 2 | -2 | 0 | 0 | 0 | 0 | 0 | 83 | 84 | 0 | 0 | 0 | 0 | 0 |
| 4.4768e-001 | 2 | -2 | 2 | -2 | 2 | 2 | -2 | 133 | 134 | 135 | 136 | 137 | 138 |
| 3.4117e-001 | 2 | -2 | 2 | -2 | -2 | 2 | 0 | 127 | 128 | 129 | 130 | 131 | 0 |
| 3.1915e-001 | 2 | -2 | 2 | 0 | 2 | -2 | 0 | 122 | 123 | 125 | 126 | 0 | 0 |
| 2.8622e-001 | 2 | -2 | 2 | 2 | 0 | 0 | 0 | 133 | 134 | 135 | 0 | 0 | 0 |
| 2.7992e-001 | 2 | -2 | 2 | -2 | 0 | 0 | 0 | 117 | 118 | 119 | 120 | 0 | 0 |

Error Event : Candidate Error Starting Position

[2 -2], [2 -2 2 -2 2 -2], [2 -2 2 2 -2], [2 -2 0 2 -2],... : [1, 2, 3, ..., n (codeword length = 203)]

Actual error event & error position
- error event : [2, -2]
- error position : [137, 138]
- syndrome = 2

- *New Scheme → Correction*

Likely error starting position set of [2 -2] = [4  11  18  25  32  39  46  60  74  81  95  102  109  137  158  179]
Likely error starting position set of [2 -2  2] = [26  82  89  131  159  173  180  201]
Likely error starting position set of [2 -2  2  -2] = [29  106  148], Likely error starting position set of [2 -2  2  -2  2] = [27]
Likely error starting position set of [2 -2  0  2 -2] = [23  37  51  177], Likely error starting position set of [2 -2  2  2 -2  2 -2] = [80]

| Confidence Value | Error Event | | | | | | | Error Position | | | | | |
|---|---|---|---|---|---|---|---|---|---|---|---|---|---|
| 4.5966e-001 (largest) | 2 | -2 | 0 | 0 | 0 | 0 | 0 | 137 | 138 | 0 | 0 | 0 | 0 | 0 |
| 2.2748e-001 | 2 | -2 | 0 | 2 | -2 | 0 | 0 | 51 | 52 | 0 | 54 | 55 | 0 | 0 |
| 2.0321e-001 | 2 | -2 | 2 | 0 | 2 | 0 | 0 | 201 | 202 | 203 | 0 | 30 | 31 | 0 |
| 1.3347e-001 | 2 | -2 | 2 | -2 | 2 | 2 | 0 | 27 | 28 | 29 | 30 | 31 | 0 | 0 |
| 7.8609e-002 | 2 | -2 | 2 | -2 | -2 | 2 | -2 | 80 | 81 | 82 | 83 | 84 | 85 | 0 |
| 5.2407e-002 | 2 | -2 | 2 | -2 | -2 | 0 | 0 | 148 | 149 | 150 | 151 | 0 | 0 | 0 |

FIG. 6

| ERROR EVENT | SYNDROME USING $G(X) = 1 + X^2 + X^3$ | | | | | | |
|---|---|---|---|---|---|---|---|
| $1 + x$ | 6 | 3 | 4 | 2 | 1 | 5 | 7 |
| $1 + x + x^2$ | 7 | 6 | 3 | 4 | 2 | 1 | 5 |
| $1 + x + x^2 + x^3$ | 2 | 1 | 5 | 7 | 6 | 3 | 4 |
| $1 + x + x^2 + x^3 + x^4$ | 5 | 7 | 6 | 3 | 4 | 2 | 1 |
| $1 + x + x^3 + x^4$ | 4 | 2 | 1 | 5 | 7 | 6 | 3 |
| $1 + x + x^2 + x^3 + x^4 + x^5$ | 3 | 4 | 2 | 1 | 5 | 7 | 6 |

FIG. 7

CRC code based on $G(X) = 1+X^2+X^3$

- Assumption: A dominant error event [2,-2] occurs in positions 3 and 4.
- Syndrome: 4, i.e, [1 0 0]
- Likely position set on [2 -2] : t = [{3, 4},{9, 10},{15, 16},{21, 22},{27,28},{33,34}]
- More probable likely position set on [2 -2]: s = [{3, 4},{9, 10},{21, 22}]

| Position | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 |
|---|---|---|---|---|---|---|---|---|---|---|---|---|---|---|---|---|---|---|---|---|---|---|---|---|---|---|---|---|---|---|---|---|---|---|---|---|
| c | 0 | 0 | 0 | 1 | 0 | 0 | 1 | 0 | 0 | 0 | 0 | 0 | 1 | 1 | 1 | 1 | 1 | 0 | 0 | 1 | 1 | 1 | 1 | 1 | 0 | 0 | 0 | 0 | 0 | 0 | 0 | 1 | 0 | 0 | 1 | 0 |
| e | 0 | 0 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| r | 0 | 0 | 1 | 0 | 0 | 0 | 1 | 0 | 0 | 0 | 0 | 0 | 1 | 1 | 1 | 1 | 1 | 0 | 0 | 1 | 1 | 1 | 1 | 1 | 0 | 0 | 0 | 0 | 0 | 0 | 0 | 1 | 0 | 0 | 1 | 0 |
| t | | | 3,4 | | | | | | 9,10 | | | | | | 15,16 | | | | | | 21,22 | | | | | | 27,28 | | | | | | 33,34 | | | |
| s | | | 3,4 | | | | | | 9,10 | | | | | | | | | | | | 21,22 | | | | | | | | | | | | | | | |

- c: transmitted codeword
- e: error event ([1 1])
- r: ML codeword
- t: set of possible starting positions of the error event based on syndrome
- s: set of more probable starting positions on the sign of bits

POST-VITERBI ERROR CORRECTION METHOD AND APPARATUS

BACKGROUND OF THE INVENTION

1. Field of the Invention

Embodiments of the invention relate generally to a Post-Viterbi error correction method and apparatus. More particularly, embodiments of the invention relate to a Post-Viterbi error correction method and apparatus adapted to reduce a probability of faulty error correction.

2. Description of Related Art

Error detection and correction techniques play an important role in many data transmission systems where noise is present and accuracy matters. For example, in many electronic data transmission systems, error detection and correction is achieved by encoding data using some form of redundant data before transmitting the data across a channel and then using the redundant data to aid a process of decoding the data.

One common technique used for error correction is known as a cyclic redundancy check (CRC). In a cyclic redundancy check, data to be transmitted across a noisy channel is multiplied by a generator polynomial to form a codeword.

In this written description, the term "transmitted codeword" will denote an original codeword to be transmitted across a channel and the term "detected codeword" will denote the codeword as detected by a receiving device after the codeword has been transmitted across the channel. In addition, the generator polynomial can be referred to more generically as an error detection code, which can be designed from various types of polynomials.

A syndrome is computed from the detected codeword by dividing the detected codeword by the generator polynomial. A detected codeword without errors yields an all-zero syndrome, and a detected codeword containing errors yields a syndrome that is not all-zero.

A post-Viterbi processor is often used to find a most probable type of error event (error type) and a start position for the error event within a detected codeword by estimating an amount of correlation between known forms of error events and an estimated error signal.

The estimated error signal is typically computed as a difference between an output signal of an equalizer and a signal generated by convolution of an output of a Viterbi decoder with a partial response polynomial. The partial response polynomial is a signal that facilitates a digitalization of an analog readback channel by reshaping the analog readback channel into a known partial response using an equalizer. The Viterbi decoder computes the detected codeword from a reshaped, digitalized equalizer output.

Due to noise and an imperfect equalizer, the detected codeword may contain errors. Accordingly, the error signal is obtained by subtracting the equalizer output from the signal computed by convolving the Viterbi decoder output with the partial response polynomial.

Figure 1:
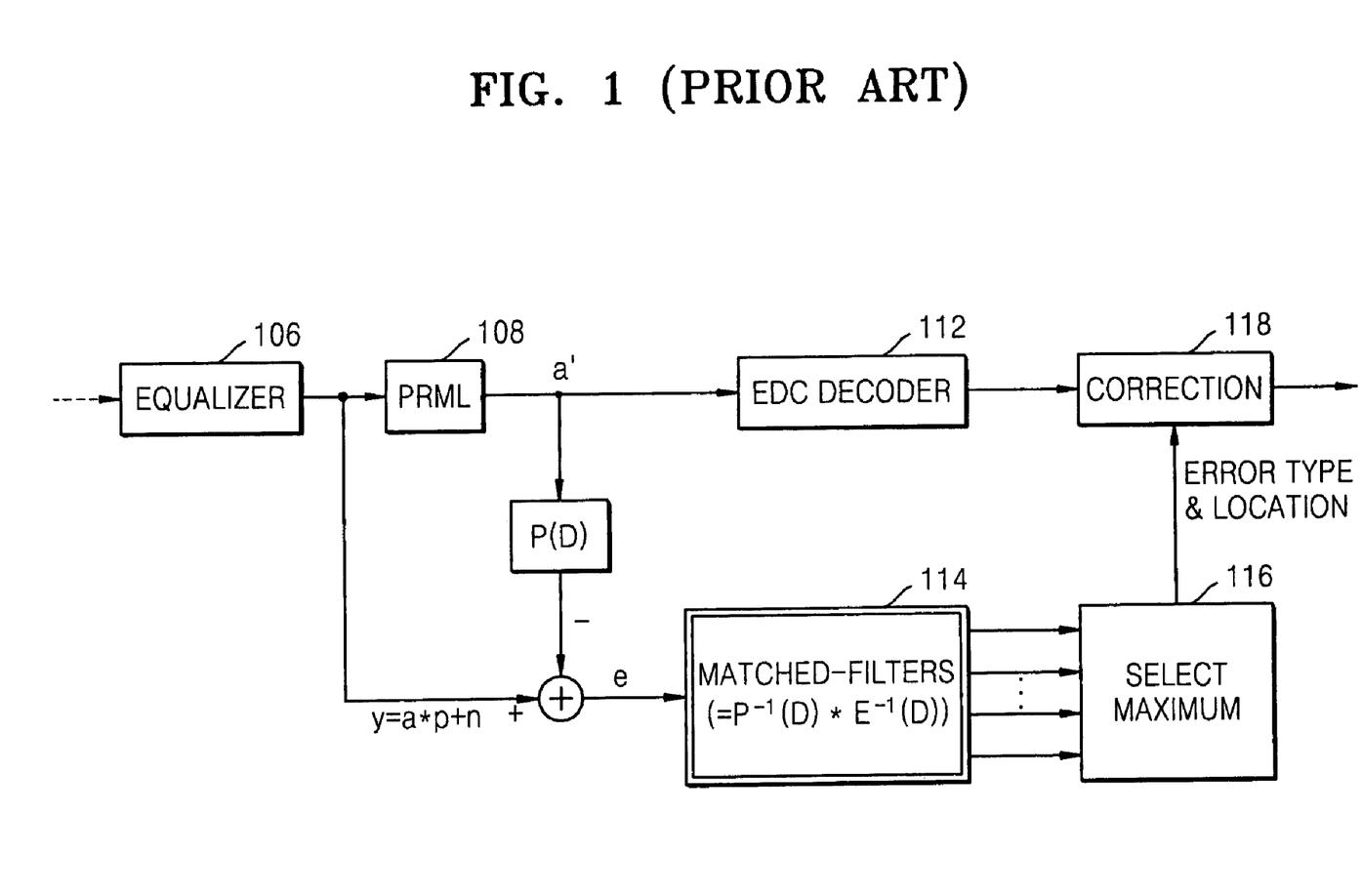
FIG. 1 is a block diagram of a conventional post-Viterbi processor.

As an example, FIG. 1 shows one type of post-Viterbi processor. Referring FIG. 1, data is encoded by an error detection coding (EDC) encoder (not shown) and transmitted through a channel which may contain noise. An equalizer unit 106 reshapes a readback channel output into a sequence which is matched to a partial response P(D), where "D" is a delay variable in a digital sequence, e.g., $P(D)=1+6D+7D^2+2D^3$.

A partial response maximum likelihood (PRML) unit 108 detects a transmitted codeword and provides an output. An error signal 'e' is generated by subtracting an output of equalizer unit 106 and the output of PRML unit 108, convolved with partial response P(D).

An EDC decoder unit 112 computes a syndrome to check for the presence of errors in the detected codeword. A matched-filters unit 114 comprises a plurality of error-event matched filters, each corresponding to a dominant error event and used to detect whether the detected codeword contains one of the dominant error events. Each error-event matched filter calculates a likelihood value, or a confidence value, that an error event occurred in the detected codeword. A select maximum unit 116 then estimates a type and position of a most likely error event. Then, based on the information about the type and position, a correction unit 118 corrects the error event.

As an example of how the post-Viterbi processor works, assume that "a" is recorded data, "a prime" (a') is recorded data decoded by PRML 108 and P(D) is a partial response polynomial. An output signal "y" of equalizer unit 106 and an error signal "e" can be expressed as $y=a*p+n$ and $e=(a-a')*p+n$, respectively, where "p" denotes a transfer function of a readback channel between the medium where the recorded data is stored and the output of the equalizer, "n" denotes noise in the readback channel, and * denotes a convolution operation.

A confidence value calculated by matched filters unit 114 can be expressed as an equation of $P^{-1}(D)*E^{-1}(D)$, where, $P^{-1}(D)$ and $E^{-1}(D)$ denote time reversals of the partial response polynomial and an error event, respectively, and * denotes an convolution operation. Respective error event matched filters in matched filters unit 114 are used to calculate a probability of each error event, e.g., a confidence value, at every position within a detected codeword.

Select maximum unit 116 produces an error type and an error start position based on the largest confidence value among outputs of matched filters unit 114. Correction unit 118 then corrects an error event according to the error type and the error start position output from select maximum unit 116.

In channels with a relatively high incidence of errors (i.e., "interference-dominant" channels), errors tend to occur in specific patterns. For example, if a transmitted codeword is [1, −1, 1, −1, 1, 1, −1, 1, −1, −1], and a detected codeword is [1, −1, 1, −1, 1, −1, 1, −1, −1, −1], then an error event [0, 0, 0, 0, 0, 2, −2, 2, 0, 0] with a with a specific pattern denoted [2, −2, 2] has occurred.

Figure 2:
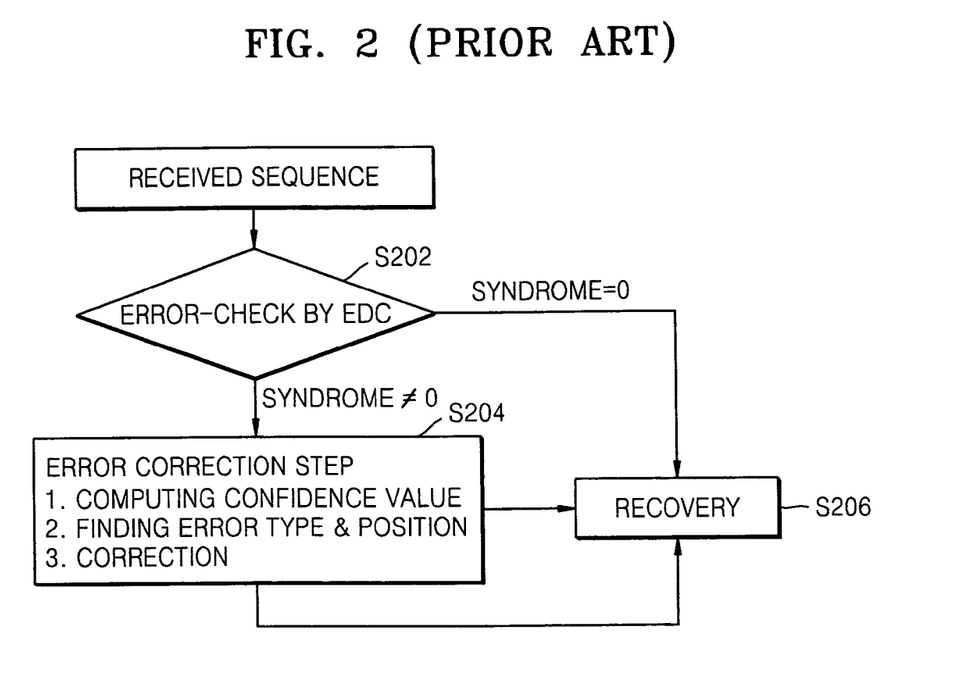
FIG. 2 is a flow chart illustrating a conventional post-Viterbi error correction method.

FIG. 2 is a flow chart illustrating a conventional Post-Viterbi error correction method.

Referring to FIG. 2, an operation S202 is performed to determine whether or not an error event has occurred in a detected codeword. In operation S202, the detected codeword is divided by a generator polynomial to produce a syndrome. If the syndrome is all zero, then the detected codeword presumably contains no errors. However, if the syndrome is not all zero, the detected codeword presumably contains some error.

If the detected codeword is determined to be error free, a data recovery process is performed in an operation S206 to recover original data from which the detected codeword was formed. The data recovery process typically removes redundant bits that were added to the data by the EDC encoder to form a transmitted codeword.

On the other hand, if the detected codeword is determined to contain errors in operation S202, a Post-Viterbi error correction process is performed in an operation S204 to correct the errors.

Operation S204 is performed under a condition of K=1, where "K" denotes a maximum number of error events which are assumed to have possibly occurred within the detected codeword. The relation of K<E should be satisfied, where "E" denotes a number of error event matched filters included in the post-Viterbi processor.

In operation 204, confidence values are computed for all possible error events with respect to every bit of the detected codeword using respective error event matched filters corresponding to respective error events. Here, each error event matched filter is configured according to dominant error events occurring in the readback channel. Errors in the detected codeword are corrected according to the most likely error event that occurred and the most likely start position of the error event, as determined by the post-Viterbi processor.

Unfortunately, conventional Post-Viterbi error correction methods, such as that shown in FIG. 2, have a high possibility of mis-correction. A mis-correction occurs where either a wrong type of error is corrected, or an error event is corrected at the wrong start position.

For example, in perpendicular magnetic recoding (PMR), an error event ±[2,−2] is often detected as ±[2,−2,2] or [2,−2,0,2,−2]. Another dominant error event [2,−2,2] is often detected as [2,−2] or [2,−2,2,−2,2,−2]. Similarly, error events ±[2,−2,2,−2,2] and [2,−2,2,−2,2,−2] are also commonly mis-detected. On the other hand, with regard to mis-corrected start positions, dominant error events [2,−2] and ±[2,−2,2] are often corrected as [2,0,−2] or [2,0,0,−2].

Figure 3:
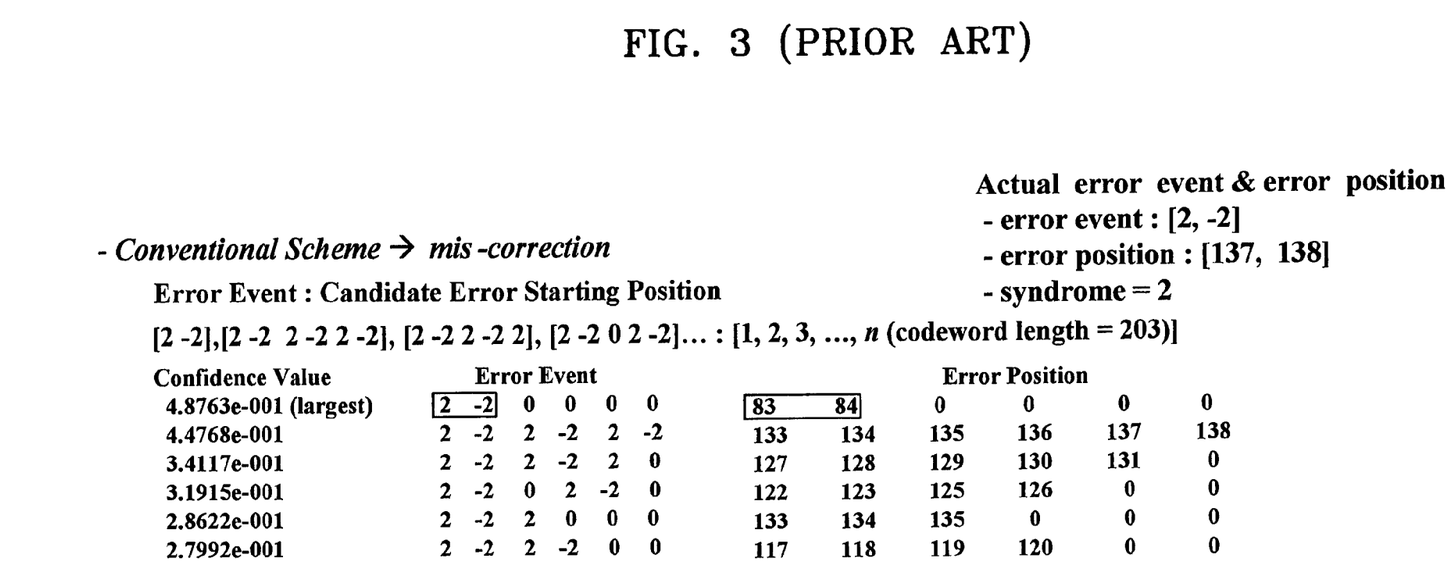
FIG. 3 is a table illustrating an example of a mis-corrected error event.

FIG. 3 shows an example of a mis-correction by a Post-Viterbi processor. In particular, FIG. 3 shows result of an error correction with a condition where an actual error event is [2,−2] and an actual error position is [137, 138]. In other words, in the example, error event [2, −2] occurred at positions of [137, 138], where dominant error events used in a Post-Viterbi processor are [2,−2], [2,−2,2], [2,−2,2,−2], [2,−2,0,2,−2], [2,−2,2,−2,2] and [2,−2.2,−2,2,−2].

As seen in FIG. 3, the error event with the largest confidence value is [2,−2] and the corresponding error positions are [83, 84]. Accordingly, error correction is performed on bits 83 and 84 within the codeword.

However, because the actual error position is [137, 138] such an error correction, as shown in FIG. 3, becomes a mis-correction by a mis-error position designation.

SUMMARY OF THE INVENTION

According to one embodiment of the invention, a method of processing a detected codeword transmitted through a communication channel is provided. The detected codeword is processed based on error events commonly produced in relation to the communication channel. In the method, a syndrome is computed by applying an error detection code to the detected codeword. Where the syndrome is not all zero a set of potential error start positions for a plurality of error events is computed based on a syndrome value corresponding to the syndrome. Next, the set of potential error start positions is refined by eliminating unlikely error start positions based on an expected error event pattern and a bit polarity of the detected codeword at each potential error start position. Then, a confidence value is computed for each of the plurality of error events at each of the potential error start positions in the refined set. Finally, a most likely error event in the detected codeword is corrected based on an error event and corresponding potential error start position having the highest confidence.

According to another embodiment of the invention, another method of processing a detected codeword transmitted through a communication channel is provided. In the method, a syndrome is computed by applying an error detection code to the detected codeword. Next, potential error start positions are computed for a plurality of potential error events based on a syndrome value corresponding to the syndrome and a bit polarity of the detected codeword. Next, a confidence value is calculated for each of the potential error events at each of the potential error start positions. Finally, a most likely error event in the detected codeword is corrected based on a potential error event and corresponding potential error start position having the highest confidence value.

According to yet another embodiment of the invention, a computer-readable data storage medium adapted to store recorded data is provided. The data can be read by encoding the data as a codeword and transmitting the codeword across a readback channel such that a receiving device can perform error correction on the codeword. The receiving device performs error correction on the codeword using a method wherein a syndrome is computed by applying an error detection code to the codeword. Then where the syndrome is not all zero, a set of potential error start positions is computed for a plurality of error events based on a syndrome value corresponding to the syndrome. Next, the set of potential error start positions is refined by eliminating unlikely error start positions based on an expected error event pattern and a bit polarity of the codeword at each potential error start position. Then, a confidence value is computed for the plurality of error events at each of the potential error start positions in the refined set. Finally, a most likely error event in the codeword is corrected based on an error event and corresponding potential error start position having the highest confidence value.

According to still another embodiment of the invention, a non-transitory computer-readable data storage medium is provided. The non-transitory storage medium is adapted to store recorded data, wherein the data can be read by encoding the data as a codeword and transmitting the codeword across a readback channel such that a receiving device can perform error correction on the codeword. The receiving device performs the error correction using a method comprising computing a syndrome by applying an error detection code to the codeword, computing potential error start positions for a plurality of potential error events based on a syndrome value corresponding to the syndrome and a bit polarity of the codeword, calculating a confidence value for each of the potential error events at each of the potential error start positions, and correcting a most likely error event in the codeword based on a potential error event and corresponding potential error start position having the highest confidence value.

According to still another embodiment of the invention, a post-Viterbi processor is provided. The post-Viterbi processor is adapted to correct errors within a codeword transmitted through a communication channel based on error events commonly produced in relation to the communication channel. The processor comprises a maximum likelihood decoder adapted to perform Viterbi-decoding on the codeword and output a Viterbi-decoded codeword, an error detection code decoder adapted to determine whether any error event occurred or not by applying an error detection code to the Viterbi-decoded codeword to generate a syndrome, an error position generating unit adapted to generate potential error positions for potential error events based on a syndrome value corresponding to the syndrome, a matched filters unit comprising a plurality of error event matched filters adapted to compute confidence values for the potential error start positions and corresponding potential error events, a select maximum unit adapted to select a largest confidence value among the confidence values computed by the matched filters unit and a type of error event and error start position corresponding to the selected confidence value, and an error event correcting unit adapted to correct an error event in the codeword based on the selected type of error event and error start position.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 4:
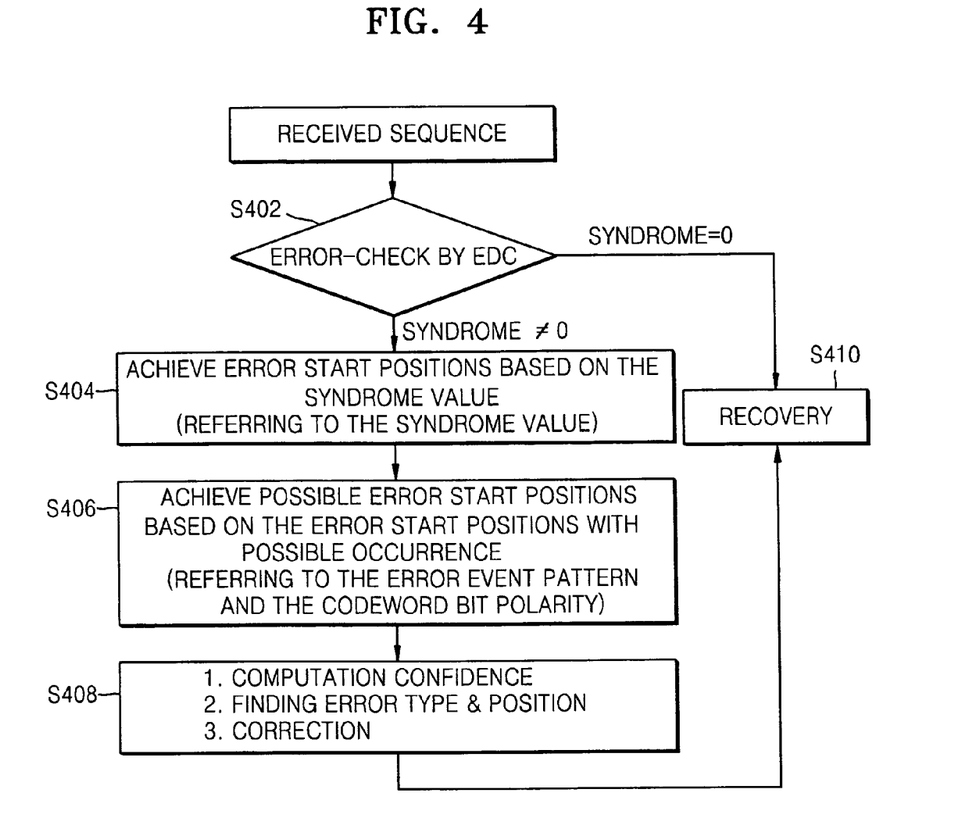
FIG. 4 is a flow-chart illustrating an error correction method according to an embodiment of the invention.

FIG. 4 is a flow chart illustrating an error correction method according an embodiment of the invention. In FIG. 4, operations S402 and S404 are similar to respective operations S202 and S204 illustrated in FIG. 2.

In operation S402, a post-Viterbi processor determines whether a detected codeword contains errors by applying an error correction code to the codeword. The error correction code can be applied to the detected codeword, for example, by dividing the detected codeword by a generator polynomial used to generate the detected codeword, and then taking the remainder of the division to generate a syndrome.

Where the syndrome is all zero, the detected codeword is considered to be free of errors and therefore a data recovery process is performed in an operation S410 to recover original data from the detected codeword. The data recovery process performed by operation S410 is similar to data recovery process performed by operation S206 in FIG. 2.

Where the syndrome is not all zeros, the detected codeword is determined to contain some errors. Accordingly, potential error start positions are computed with reference to a syndrome value in an operation S404.

Next, in an operation S406, possible error start positions are computed with reference to the potential error start positions computed in operation S404, combined with bit polarities of the detected codeword at the potential error start positions. By using the bit polarities of the detected codeword, more probable error start positions can be obtained by eliminating error start positions that cannot possibly occur.

Next, in an operation S408, error correction is performed by determining confidence values for each possible type of error among a set of dominant error events, wherein the probability of each dominant error event is computed for the possible error start positions computed in operation S406. Subsequently, an error event corresponding to a largest one among the confidence values is selected, and then error event is corrected. Once the error event is corrected in operation S408, a data recovery process is performed by operation S410.

Figure 5:
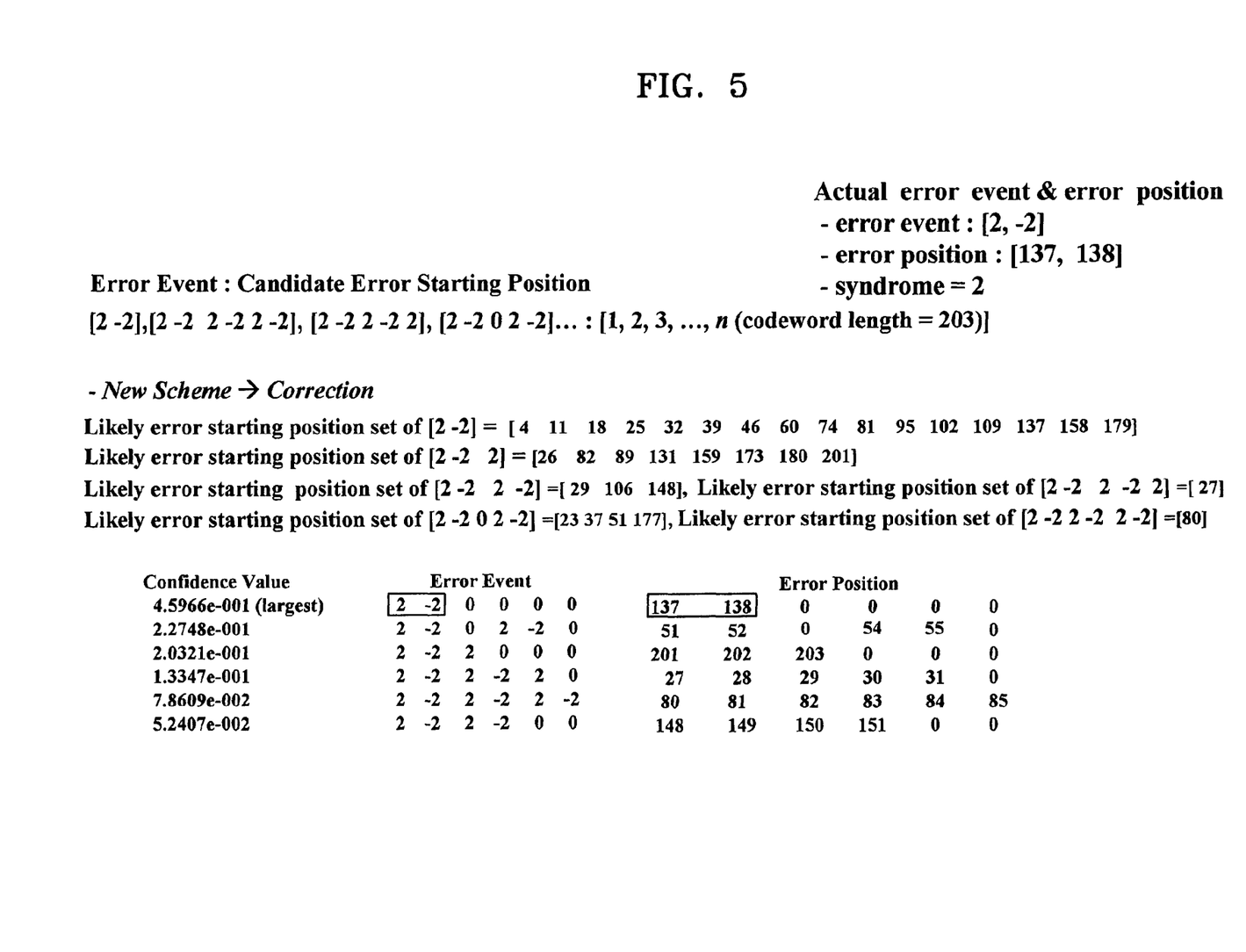
FIG. 5 is a table illustrating results of using the error correction method illustrated in FIG. 4.

FIG. 5 is a table illustrating results of performing error correction using a post-Viterbi error correction method according to one embodiment of the invention. In particular, FIG. 5 shows results of the error correction where an actual error event is [2,–2] and an actual error position is [137, 138], as in FIG. 3, and a syndrome value is 2.

As illustrated in FIG. 5, possible error start positions for the error event [2,–2] were computed with reference to a syndrome value. These possible start positions are listed as [4, 11, 18, 25, 32, 39, 46, 60, 74, 81, 95, 102, 109, 137, 158, 179].

Comparing FIG. 5 with FIG. 3, confidence values for the error event [2, –2] are computed at every bit of a detected codeword in the conventional method illustrated in FIG. 2, but the confidence values are computed at positions [4, 11, 18, 25, 32, 39, 46, 60, 74, 81, 95, 102, 109, 137, 158, 179] within the detected codeword in the method illustrated in FIG. 4.

Possible error start positions for the error event [2,–2,2] is computed with reference to the syndrome value. These possible start positions are [26, 82, 89, 131, 159, 173, 180, 201].

Comparing FIG. 5 with FIG. 3 once again, confidence values for the error event [2, –2, 2] are calculated at every bit of the detected codeword in the conventional method illustrated in FIG. 2, while confidence values are computed at positions [26, 82, 89, 131, 159, 173, 180, 201] in the method illustrated in FIG. 4.

Possible error start positions for the error event [2,–2,2,–2] are also computed with reference to the syndrome value. These possible start positions are [29, 106, 148].

Comparing FIG. 5 with FIG. 3, confidence values for the error event [2, –2, 2,–2] are computed for every bit of the detected codeword in the conventional method illustrated in FIG. 2, while confidence values are only computed at positions [29, 106, 148] within the detected codeword in the method illustrated in FIG. 4.

Possible error start positions for the error event of [2,–2, 2,–2,2] are also computed with reference to the syndrome value. These possible error start positions are [27].

Comparing FIG. 5 with FIG. 3, confidence values for the error event [2, –2, 2,–2,2] are calculated at every bit within the detected codeword in the conventional method illustrated in FIG. 2, while confidence values are computed only for positions [27] within the detected codeword in the method illustrated in FIG. 4.

Possible error start positions for the error event [2,–2,0,–2,2] are computed with reference to the syndrome value. These possible error start positions are [23, 37, 51, 177].

Comparing FIG. 5 with FIG. 3, confidence values for the error event [2, –2, 0,–2,2] are computed for every bit within the detected codeword in the conventional method illustrated in FIG. 2, while confidence values are only computed for positions [23, 37, 51, 177] within the detected codeword in the method illustrated in FIG. 4.

Possible error start positions for the error event [2,-2,2,-2,2,-2] are also computed with reference to the syndrome value. These possible error start positions are [80].

Comparing FIG. 5 with FIG. 3, confidence values for the error event [2, -2, 2,-2,2,-2] are computed for every bit within the detected codeword in the conventional method illustrated in FIG. 2, while confidence values are computed only for position [80] within the detected codeword in the method illustrated in FIG. 5.

As shown in FIG. 5, the error event and position with the highest confidence value is the correct error event and position. Accordingly, by using the method illustrated in FIG. 4 rather than the conventional method illustrated in FIG. 2, mis-correction is avoided.

As illustrated by the table in FIG. 5, the method of FIG. 4 can significantly reduce the number of error start positions for which confidence values are computed relative to conventional methods. In addition, the method of FIG. 4 tends to reduce the possibility of mis-correction.

Figure 6:
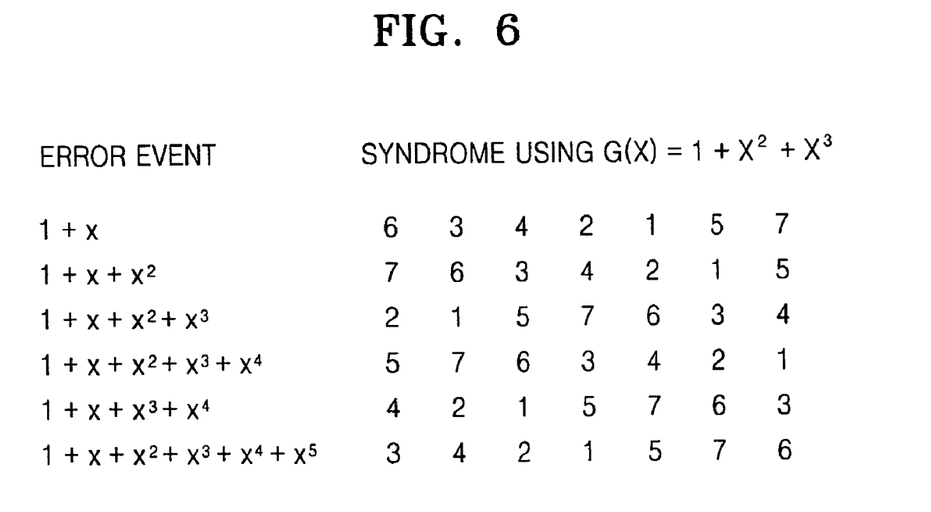
FIG. 6 is a table illustrating a relationship between a syndrome value and corresponding error positions.

FIG. 6 is a table illustrating a relationship between a syndrome value and an error position. In the table of FIG. 6, a generation polynomial $G(X)=1+X^2+X^3$ is used as an error detection code, and error events are $1+x$, $1+x+x^2$, $1+x+x^2+x^3$, $1+x+x^2+x^3+x^4$, $1+x+x^3+x^4$, and $1+x+x^2+x^3+x^4+x^5$. As seen in FIG. 6, the syndrome value for each error event is not 0, and the syndrome value is repeated in a constant order for bits within a detected codeword.

A non-zero syndrome value indicates that an error event has occurred, even if the type of error event cannot be determined. Moreover, the non-zero syndrome denotes that the error event occurred at the position where the non-zero syndrome value was computed by an error detection code. The error detection code can be designed from a primitive polynomial or non-primitive polynomial.

The example shown in FIG. 6 is disclosed in further detail in the Korean patent application No. 04-101117 filed Dec. 12, 2003.

Figure 7:
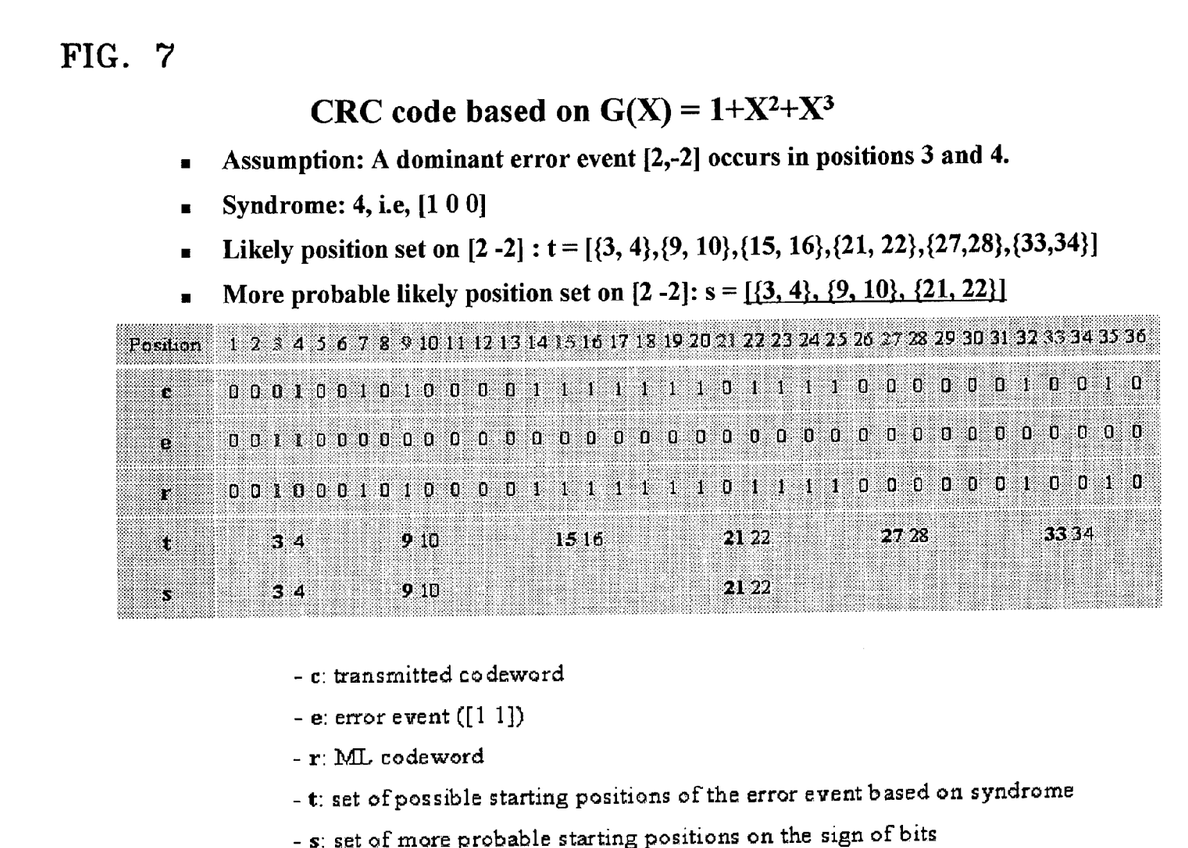
FIG. 7 is a table illustrating how possible error start positions are generated with reference to a syndrome value according to an embodiment of the invention.

FIG. 7 shows one way to compute possible error start positions with reference to a syndrome value according to an embodiment of the present invention.

Referring to FIG. 7, a generation polynomial used to generate an error detection code is $G(x)=1+X^2+X^3$, an error event of [2,-2] is occurred at 3rd and 4th bits within a detected codeword, and a syndrome value is 4.

Referring to the syndrome value, a combination "t" of possible error positions for the error event of [2,-2] is [{3,4}, {9,10},{15,16},{21,22},{27,28},{33,34}].

Meanwhile, referring to the error event [2,-2] and a bit pattern of the codeword at the possible error position, a combination "s" of possible error positions [{3,4},{9,10},{21, 22}] is computed by eliminating possible error positions [{15,16}, {27,28}, {33,34}] because the error pattern of [2,-2] cannot have occurred at these positions.

Figure 8:
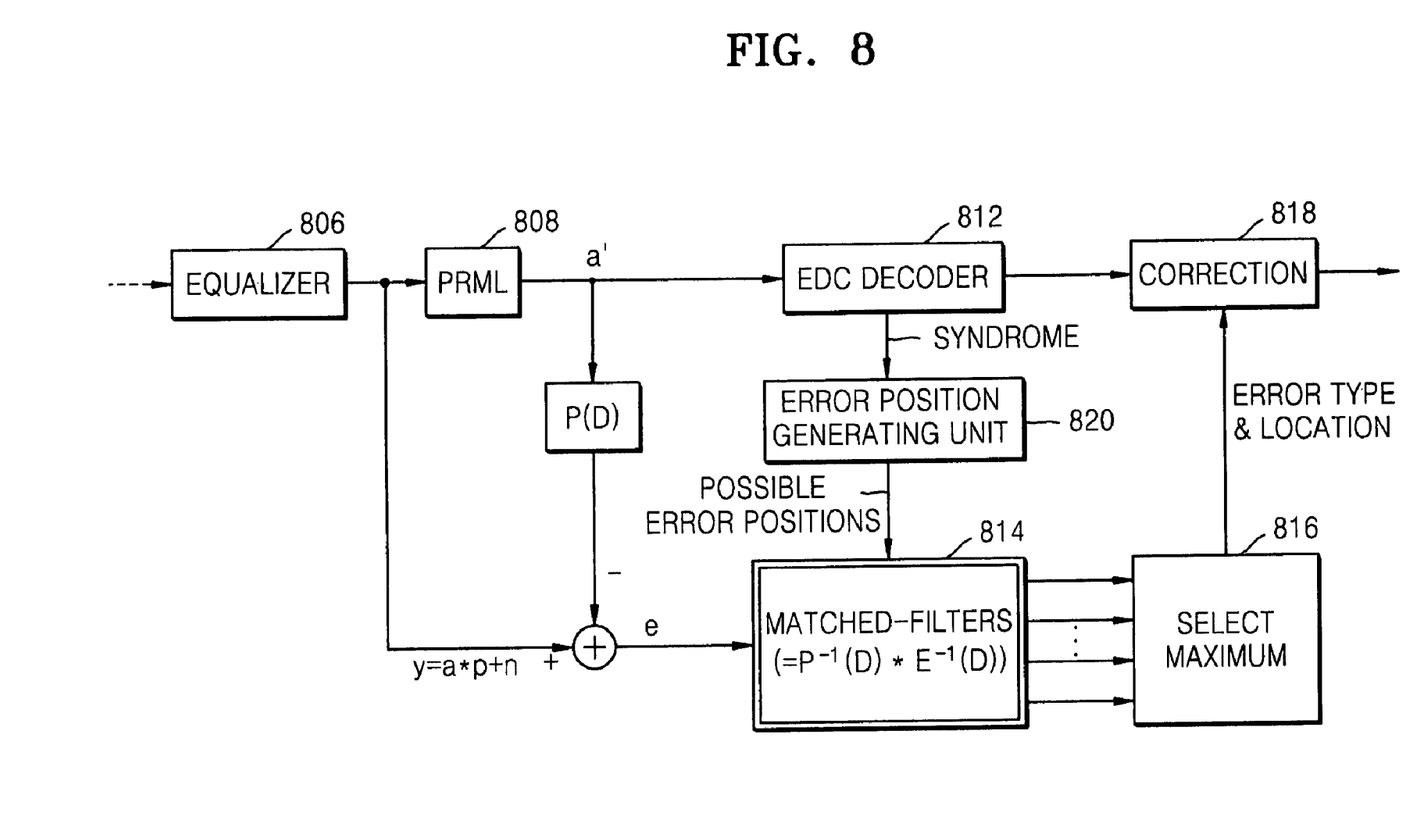
FIG. 8 is a block diagram of a post-Viterbi processor according to an embodiment of the invention; and, FIGS. 9 and 10 are graphs illustrating bit error rates and sector error rates, respectively, of data streams employing conventional error correction techniques and error correction techniques according to an embodiment of the invention, respectively.

FIG. 8 shows a block diagram illustrating a post-Viterbi processor according to one embodiment of the invention.

The operations performed by blocks 806 through 818 in FIG. 8 are similar to those performed by respective blocks 106 through 118 in FIG. 1. Accordingly, detailed descriptions of these blocks will be omitted to avoid redundancy. However, the processor illustrated in FIG. 8 further includes an error position generating unit 820 not included in FIG. 1.

Error position generating unit 820 generates possible error start positions with reference to a syndrome value calculated by an error detection code decoder 806.

Error position generating unit 820 primarily generates possible error start positions based on the repeatability of a syndrome, as described with reference to FIG. 4 through FIG. 7, and then generates more possible error start positions by referring to the possible error start positions.

A matched filters unit 814 calculates confidence values for the possible error start positions generated by error position generating unit 820.

Matched filters unit 114 shown in FIG. 1 calculates confidence values at every bit within a detected codeword, while matched filters unit 814 shown in FIG. 8 calculates confidence values only for the possible error start positions generated by error position generating unit 820.

A select maximum unit 816 selects an error event and corresponding start position having a largest confidence value according to the confidence values computed by matched filters unit 814. An error correction unit 818 then corrects the error event selected by select maximum unit 816.

Figure 9:
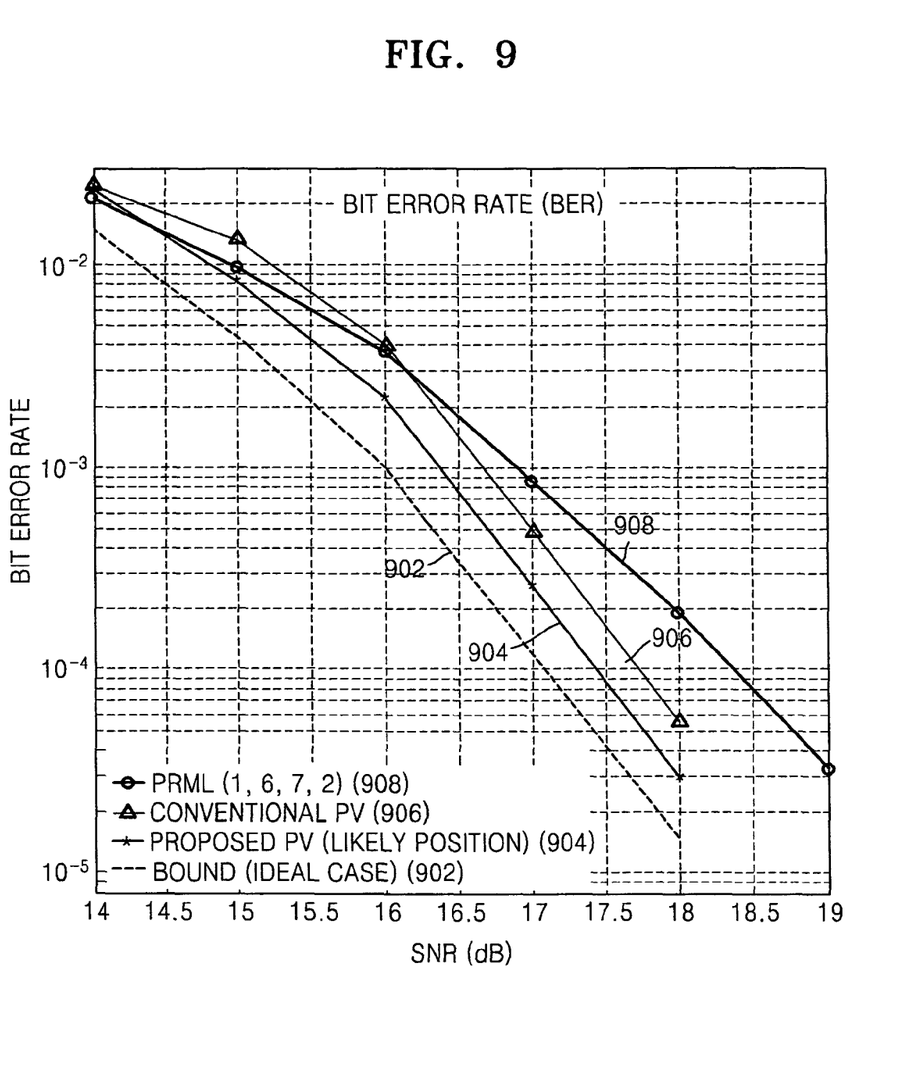

FIG. 9 is a graph illustrating results of simulation of the post-Viterbi error correction method illustrated in FIG. 4. In FIG. 9, vertical and horizontal axes denote a bit error rate (BER) and a signal to noise ratio (SNR) respectively. The SNR relates to a noisy readback channel through which data is read from a storage medium, and the BER is measured with respect to data after error correction has been performed.

Referring to FIG. 9, reference numeral 902 denotes a theoretical optimum BER for the Post-Viterbi error correction method. Reference numeral 904 denotes a BER of a Post-Viterbi error correction method according to an embodiment of the invention. Reference numeral 906 denotes a BER of a conventional method. Reference numeral 908 denotes a BER where no post-Viterbi error correction is performed.

As illustrated by FIG. 9, better BER performance can be achieved through the post-Viterbi error correction method illustrated in FIG. 4 than through conventional post-Viterbi error correction methods such as that illustrated in FIG. 2.

Figure 10:
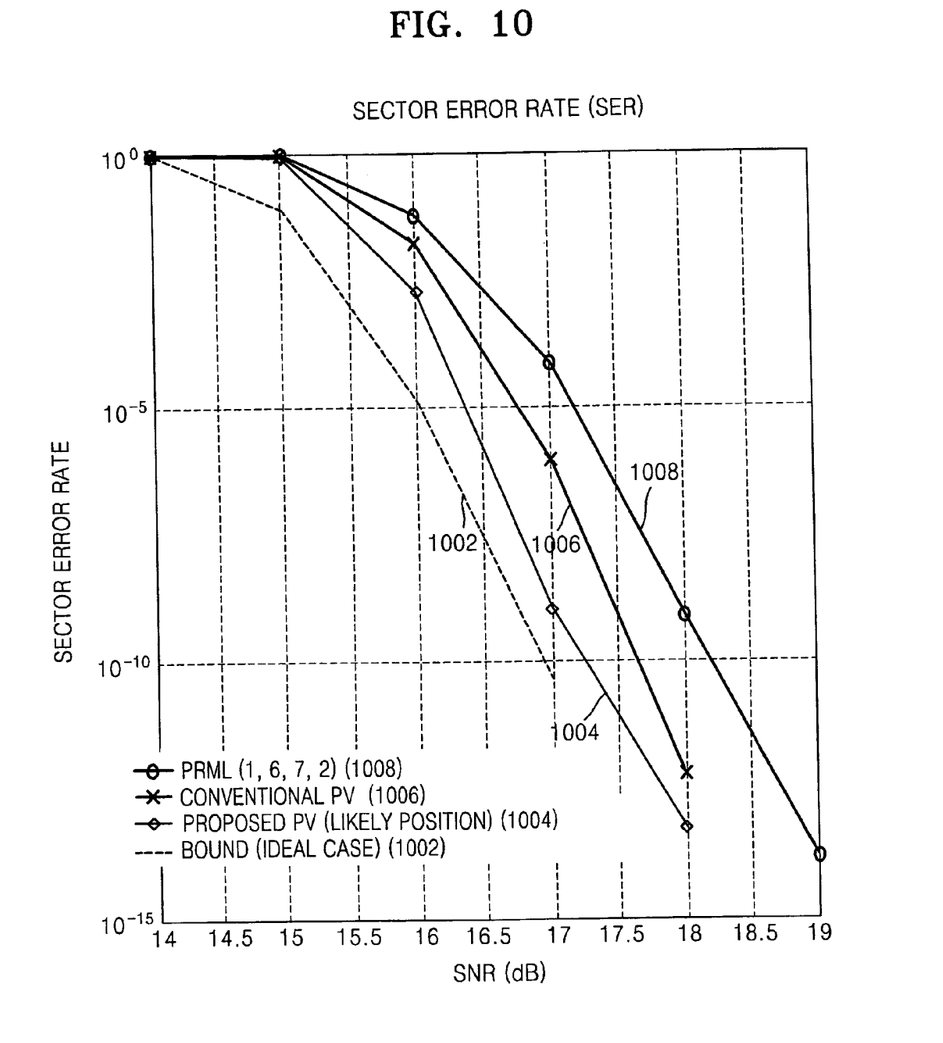

FIG. 10 is another graph illustrating results of simulation of the post-Viterbi error correction according to an embodiment of the present invention. In FIG. 10, vertical and horizontal axes denote a sector error rate (SER) and a signal to noise ratio (SNR) respectively. The SNR relates to a noisy readback channel through which data is read from a storage medium, and the SER is measured with respect to data after error correction has been performed.

In FIG. 10, reference numeral 1002 denotes a theoretical optimum SER for a post-Viterbi error correction method. Reference numeral 1004 denotes a SER of the post-Viterbi error correction method illustrated in FIG. 4. Reference numeral 1006 denotes a SER of the conventional post-Viterbi error correction method illustrated in FIG. 2. Reference numeral 1008 denotes a SER where no post-Viterbi error correction is performed.

As illustrated by FIG. 10, better SER performance can be achieved through the post-Viterbi error correction method illustrated in FIG. 4 than through conventional post-Viterbi error correction methods such as that illustrated in FIG. 2.

As described above, embodiments of the present invention simplify the calculations performed in a post-Viterbi error correction method, and prevent mis-corrections from occurring.

The foregoing preferred embodiments are teaching examples. Those of ordinary skill in the art will understand that various changes in form and details may be made to the exemplary embodiments without departing from the scope of the present invention as defined by the following claims.

What is claimed:

1. A method of processing a detected codeword transmitted through a communication channel based on error events commonly produced in relation to the communication channel, the method comprising:

(a) computing a syndrome by applying an error detection code to the detected codeword;

(b) computing potential error start positions for a plurality of potential error events based on a syndrome value corresponding to the syndrome and a bit polarity of the detected codeword;

(c) calculating a confidence value for each of the potential error events at each of the potential error start positions; and, (d) correcting a most likely error event in the detected codeword based on a potential error event and corresponding potential error start position having the highest confidence value as computed in (c).

2. The method of claim 1, wherein (b) comprises:

computing error start positions for each potential error event based on the syndrome value;

computing more likely potential error start positions by eliminating potential error start positions that are unlikely to occur based on an error event pattern and a bit polarity of the detected codeword at each potential error start position.

3. The method of claim 1, wherein the error detection code is based on a cyclic code.

4. A non-transitory computer-readable data storage medium adapted to store recorded data, wherein the data can be read by encoding the data as a codeword and transmitting the codeword across a readback channel such that a receiving device can perform error correction on the codeword using a method comprising:

(a) computing a syndrome by applying an error detection code to the codeword;

(b) computing potential error start positions for a plurality of potential error events based on a syndrome value corresponding to the syndrome and a bit polarity of the codeword;

(c) calculating a confidence value for each of the potential error events at each of the potential error start positions; and, (d) correcting a most likely error event in the codeword based on a potential error event and corresponding potential error start position having the highest confidence value as computed in (c).

5. The non-transitory recording medium of claim 4, wherein (b) comprises:

computing error start positions for each potential error event based on the syndrome value;

computing more likely potential error start positions by eliminating potential error start positions that are unlikely to occur based on an error event pattern and a bit polarity of the codeword at each potential error start position.

6. The non-transitory recording medium of claim 4, wherein the error detection code is based on a cyclic code.

\* \* \* \* \*